(12) United States Patent
Audino et al.

(10) Patent No.: US 7,320,331 B1
(45) Date of Patent: Jan. 22, 2008

(54) IN-SITU PLASMA CLEANING DEVICE FOR CYLINDRICAL SURFACES

(75) Inventors: Michael J. Audino, Albany, NY (US); Michael Cipollo, East Greenbush, NY (US); David Glocker, West Henrietta, NY (US); Kevin Miner, Castleton, NY (US); Patrick Vottis, Schnectady, NY (US)

(73) Assignee: United States of America as represented by the Secrertary of the Army, Washington, DC (US)

( * ) Notice: Subject to any disclaimer, the term of this patent is extended or adjusted under 35 U.S.C. 154(b) by 689 days.

(21) Appl. No.: 10/605,432

(22) Filed: Sep. 30, 2003

(51) Int. Cl.
*C23C 14/34* (2006.01)
*B08B 3/00* (2006.01)

(52) U.S. Cl. .............. 134/166 R; 134/1; 134/1.1; 134/104.2; 134/122 R; 156/345.42; 156/345.46; 156/345.49; 204/298.21; 204/298.22; 204/298.31; 204/298.37

(58) Field of Classification Search ........... 204/298.21, 204/298.22, 298.31, 298.37; 156/345.42, 156/345.46, 345.49; 134/1, 1.1, 104.2, 122 R, 134/166 R
See application file for complete search history.

(56) References Cited

U.S. PATENT DOCUMENTS 4,031,424 A * 6/1977 Penfold et al. ......... 204/192.12

* cited by examiner

*Primary Examiner*—Rodney G. McDonald
(74) *Attorney, Agent, or Firm*—Michael C. Sachs

(57) ABSTRACT

An in-situ plasma cleaning device (PCD) performs an atomic surface cleaning process to remove contaminants and/or to modify the cylindrical surfaces of both the target and substrate. The atomic cleaning process utilizes a plasma generated locally within the in-situ plasma cleaning device with suitable properties to clean both the target and substrate cylindrical surfaces either concurrently or separately. Moreover, the in-situ plasma cleaning device is designed to traverse the length of the target and the substrate cylindrical surfaces during the cleaning process.

1 Claim, 13 Drawing Sheets

IN-SITU PLASMA CLEANING DEVICE FOR CYLINDRICAL SURFACES

FEDERAL RESEARCH STATEMENT

The inventions described herein may be manufactured, used, and licensed by, or for the U.S. Government for U.S. Government purposes.

BACKGROUND OF INVENTION

Field of the Invention

The present invention relates in general to the field of atomically cleaned surface preparation prior to surface coating, and particularly relates to a new method of removal and/or modification of the contaminant and/or substrate material for preparing long cylindrical surfaces prior to surface coating by cylindrical magnetron sputtering (CMS). More specifically, the invention features an in-situ plasma cleaning device (PCD) that enables the removal and collection of material from either or both target and substrate cylindrical surfaces. Additionally, the ability for the in-situ PCD to be stowed inside the cleaning cylindrical chamber for the application of the CMS coating eliminates the need for exposing the system to ambient atmospheric environment which would introduce contamination that would result in a less than desirable deposited coating.

BACKGROUND OF THE INVENTION

Cylindrical surfaces frequently undergo various types of coating to achieve certain functional or design purposes. For example, a cylindrical surface may receive a coating treatment to enhance its wear protection or to restore its dimension to the original specification. Depending on the degree of the fineness of the coating as required in a certain application, the cylindrical surface in general must undergo a surface preparation process of varying degree of complexity prior to receiving the coating. In addition to the fineness of the coating, the size of the cylindrical surface also dictates the method of surface preparation. For example, in some specialized cases involving long cylindrical surfaces, the method of surface preparation becomes highly specialized for this particular type of system.

In general, the surface preparation involves the removal of contaminants from the cylindrical surfaces for disposal. Upon the removal of the contaminants, a coating process is then applied onto the cleaned surfaces for depositing the coating material to a prescribed fineness and dimension. Currently, there exist many different coating processes designed for various different applications. One such coating process commonly used for cylindrical surfaces utilizes a method of cylindrical magnetron sputtering (CMS) for depositing the coating material.

In general, the cylindrical magnetron sputtering is an electrical vacuum based vapor deposition process that is used to sputter, or deposit, the coating material from a cylindrical source, known as a target, onto another cylindrical surface, called a substrate. Generally, the target and the substrate are concentric cylinders. One arrangement would be such that the target is an inner solid cylinder or cylindrical tube and the substrate is an outer cylindrical tube or barrel. The converse arrangement also applies.

In certain applications involving long cylindrical surfaces such as gun or cannon barrels, the former arrangement is much more prevalent than the latter. That is, the target cylinder, typically in these applications, is positioned inside and concentric to the substrate cylindrical barrel.

The state of the art in the cylindrical magnetron sputtering systems for preparing long cylindrical surfaces prior to coating is to clean both the target and substrate surfaces onto a collector shield, or a plurality of collector shields. Thereupon, the collector shields are transferred to another location for further processing.

In general, the collector shields are formed of cylindrical surfaces that fit inside the inner wall of the substrate cylindrical tube with high degree of precision. The collector shields typically span a substantial length of the substrate cylindrical barrel. In long cylindrical systems, these collector shields would need a large amount of physical space for storage. Alternatively, they would need to be removed from the system for relocation, thus necessitating an opening of the substrate cylindrical barrel, which is normally sealed during the surface preparation. As a result of exposure to ambient atmospheric environment, contaminants would be reintroduced back into the cylindrical systems, thereby compromising the cleaning process.

In a conventional process, in order to attempt to reduce new contamination from the atmosphere, a clean gas is usually flushed through the substrate cylindrical barrel upon opening. In spite of gas flushing, contamination of cylindrical surfaces still occurs, thus leading to a compromise in the performance of the vacuum system of the ensuing cylindrical magnetron sputtering process. As a result, coating quality and adhesion of the target material onto the substrate cylindrical surface may be significantly degraded.

Thus, there is currently an unfulfilled need for an improved method of cylindrical surface preparation that will perform the process of cleaning long cylindrical surfaces satisfactorily. Recognizing that the source of recontamination is caused by the opening of the cylindrical system in between processes to remove and reposition the collector shields, the improved method preferably would not rely on the process of removal and relocation of the collector shields from the substrate cylindrical barrel in between processes, thereby eliminating the source of recontamination.

SUMMARY OF INVENTION

It is a feature of the present invention to provide an in-situ plasma cleaning device (PCD) for performing an atomic surface cleaning process to remove contaminants and/or modify the cylindrical surfaces of both the target and substrate. According to the present invention, the atomic cleaning process utilizes a plasma generated locally within the in-situ plasma cleaning device with suitable properties to clean both the target and substrate cylindrical surfaces at the same time or separately. Moreover, the in-situ plasma cleaning device is designed to traverse the length of the target and the substrate cylindrical surfaces during the cleaning process. Further novelties of the present invention are enumerated as follows:

1. The in-situ plasma cleaning device is a self-contained unit that is designed to perform cleaning and be stowed in-situ, when not needed, within the long cylindrical system without requiring the system to be open to the ambient atmospheric environment during the cleaning process to remove the collector shields, as in the case with the conventional process.

2. The in-situ plasma cleaning device is comprised of a plurality of target and substrate cleaning assemblies wherein a generally axially directed magnetic field is individually provided for the local generation of the plasma for cleaning the cylindrical surface within each cleaning assembly. Each cleaning assembly incorporates a collector shield opposing to the cylindrical surface to be cleaned for collecting contaminants and by-product material during the cleaning operation.

3. The in-situ plasma cleaning device is of a modular design allowing the use of a combination of one or more target and substrate cleaning assemblies in any order. The target and substrate cleaning assemblies are designed to properly interface for a modular interconnection. Thus, there are several variations of the in-situ plasma cleaning device, depending on the cylindrical magnetron sputter cleaning or surface modification process involved. Notwithstanding, the basic function of the in-situ plasma cleaning device remains the same.

The in-situ plasma cleaning device of the present invention affords a number of advantages over the conventional processes. One such clear advantage is the ability for the in-situ plasma cleaning device to perform cleaning of cylindrical surfaces in a closed volume process that effectively eliminates the source of recontamination as is in the conventional process.

A further advantage is the ability to tune the locally generated plasma to attain suitable properties for different target and substrate materials. As a result, the adhesion and coating quality is substantially improved over that of a conventional process.

The modular design of the in-situ plasma cleaning device provides yet another advantage in that the in-situ plasma cleaning device can be adapted to any particular application involving long cylindrical surfaces by simply building the device from a suitable number of target and substrate cleaning assemblies.

BRIEF DESCRIPTION OF DRAWINGS

The features of the present invention and the manner of attaining them, will become apparent, and the invention itself will be understood by reference to the following description and the accompanying drawings, wherein.

Similar numerals in the drawings refer to similar elements. It should be understood that the sizes of the different components in the figures might not be in exact proportion, and are shown for visual clarity and for the purpose of explanation.

DETAILED DESCRIPTION

Figure 1:
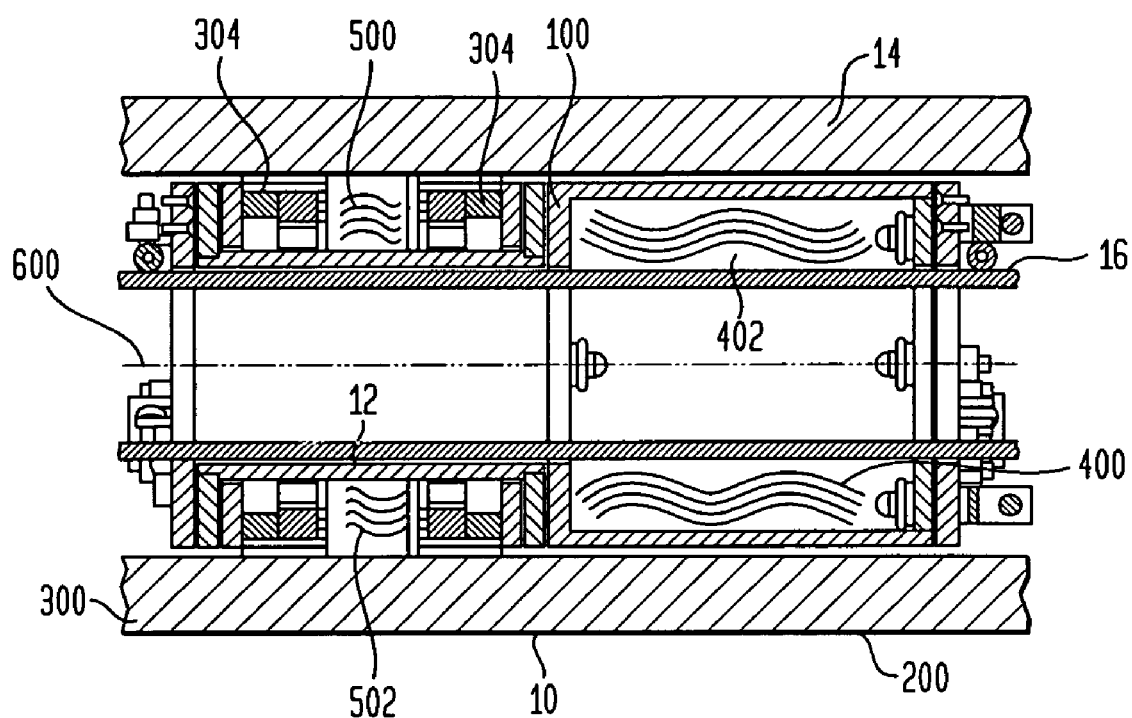
FIG. 1 illustrates a long cylindrical system comprising of a target cylindrical tube and a substrate cylindrical barrel, and an in-situ plasma cleaning device made according to a preferred embodiment of the present invention.

FIG. 1 illustrates a long cylindrical system 10 comprising of an inner target cylindrical tube 12 and an outer substrate cylindrical barrel 14. The inner target cylindrical tube 12 and the substrate cylindrical barrel 14 are generally concentric and co-located, with the inner target cylindrical tube 12 positioned inside the substrate cylindrical barrel 14.

Located within the annular space 16 between the inner target cylindrical tube 12 and the substrate cylindrical barrel 14 is an in-situ plasma cleaning device 100 made according to the present invention. FIG. 1 illustrates a preferred embodiment of the in-situ plasma cleaning device 100 of the present invention. In particular, the in-situ plasma cleaning device 100 is comprised of a plurality of target cleaning assemblies 200 and a plurality of substrate cleaning assemblies 300, only one of each is shown in FIG. 1.

Figure 2A:
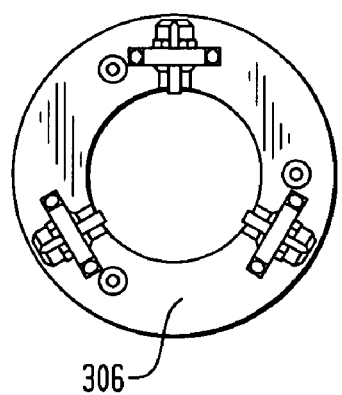
FIGS. 2A-2C are views of the in-situ plasma cleaning device of FIG. 1 comprising of a target cleaning assembly and substrate cleaning assembly.
Figure 2B:
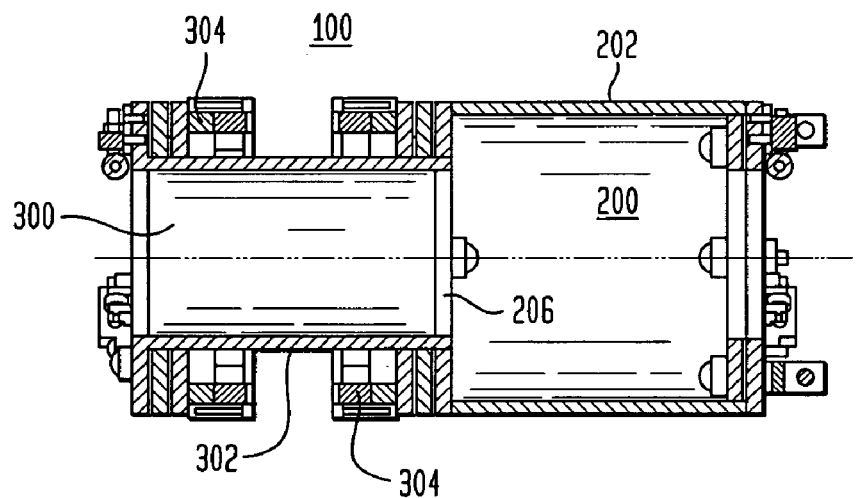
Figure 2C:
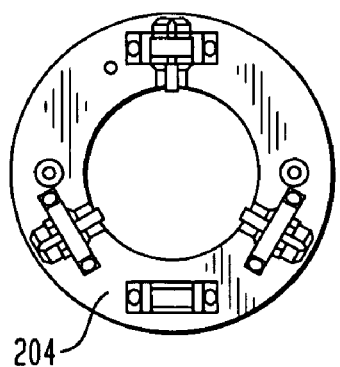

With reference to FIG. 2, the preferred embodiment of the in-situ plasma cleaning device 100 is shown to comprise of a target cleaning assembly 200 connected to a substrate cleaning assembly 300. The target cleaning assembly 200 is generally comprised of a target collector shield 202, a target cleaning end cap assembly 204, and a target interface plate 206, as referenced in FIGS. 3 to 12 (which may also be referred to as a top cap). The substrate cleaning assembly 300 is connected to the target cleaning assembly 200 via the target interface plate 206. The substrate cleaning assembly 300 is generally comprised of a substrate collector shield 302, two magnet assemblies 304, and a substrate cleaning end cap assembly 306, as referenced in FIGS. 13 to 22 (which may also be referred to as a bottom cap in the disclosure).

Figure 3A:
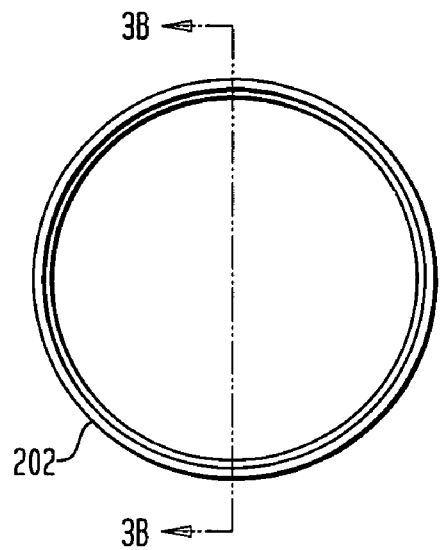
FIGS. 3A-3B are views of a target collector shield of the target cleaning assembly of FIG. 2.
Figure 3B:
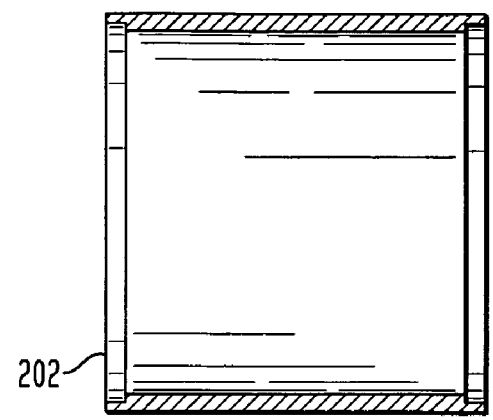

With reference to FIG. 3, the target collector shield 202 is generally formed of a cylindrical tube that fits closely inside the substrate cylindrical barrel 14 with a high degree of precision. The outside diameter of the target collector shield 202 is substantially equal to the inside diameter of the substrate barrel 14 minus a very small dimensional tolerance to allow the target cleaning assembly 200 to freely move inside the substrate cylindrical barrel 14. Be for example only, the outside diameter of the target collector shield 202 may be of a dimension of 4.6 inches. At the two distal ends of the target collector shield 202 are formed two small internal threaded areas whereon a target inner end plate 208 and the target interface plate 206 are threaded into the target collector shield 204.

Figure 4A:
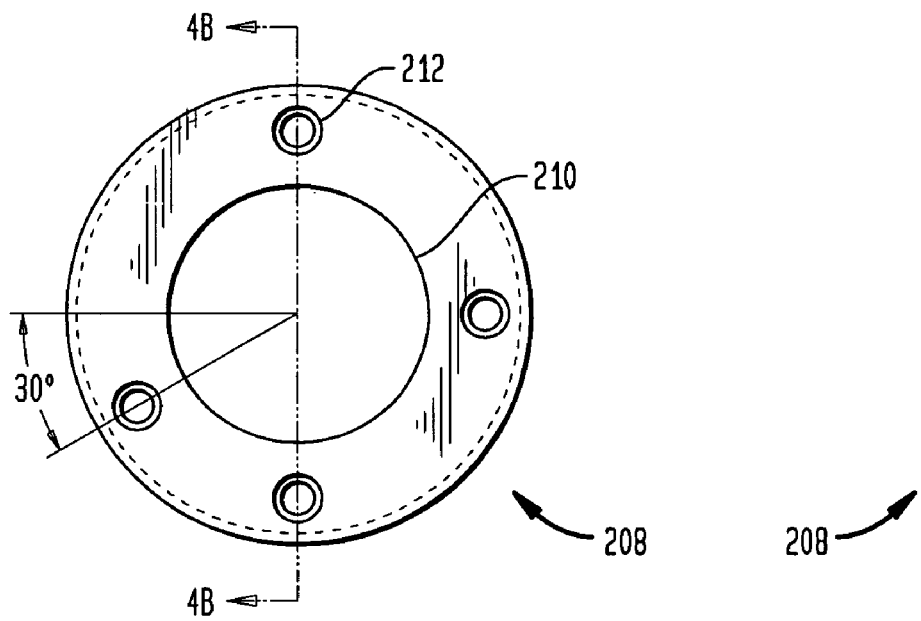
FIGS. 4A-4B are views of a target inner end plate of the target cleaning assembly of FIG. 2.
Figure 4B:
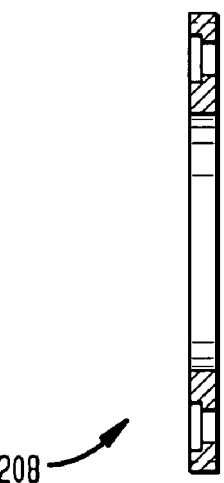

With reference to FIG. 4, the target inner end plate 208 is made of a thin circular plate having a central hole 210. The diameter of the central hole 210 is substantially equal to the outside diameter of the target cylindrical tube 12 plus a very small tolerance to allow the target cleaning assembly 200 to freely move along the target cylindrical tube 12 without interference. Be for example only, the diameter of the central hole 210 may be of a dimension of 2.475 inches. A plurality of fastener holes 212 are formed in the target inner end plate 208. FIG. 4 illustrates four such fastener holes 212.

Figure 5A:
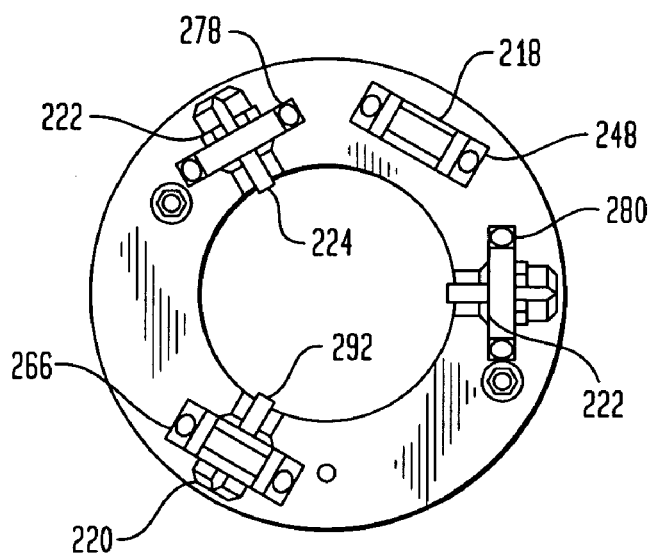
FIGS. 5A-5C are views of a target cleaning end cap assembly of the target cleaning assembly of FIG. 2.
Figure 5B:
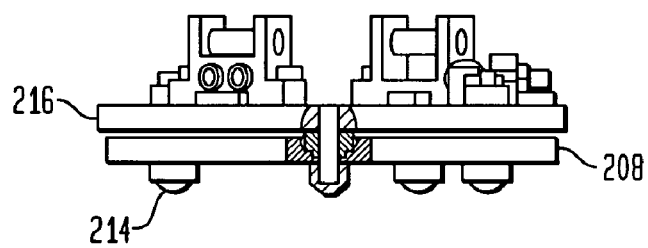
Figure 5C:
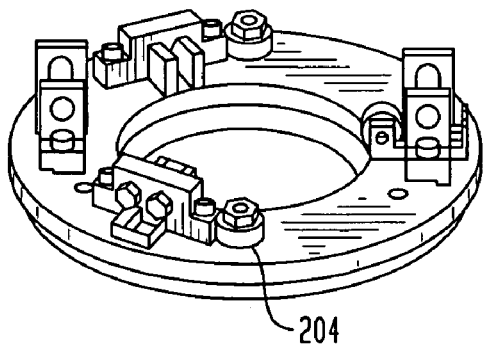

With reference to FIGS. 2 and 5, the target cleaning end cap assembly 204 is secured to the target inner end plate 208 by a plurality of fasteners 214 through the fastener holes 212. The fasteners 214 possess certain electrical insulating properties to isolate the target cleaning end cap assembly 204 electrically from the target inner end plate 208. The target cleaning end cap assembly 204 is generally comprised of a target cleaning end cap 216 which is fastened to the target inner end plate 208, a strip support 218, a plunger strip support 220, two spring roller supports 222, and three roller blocks 224. The three roller blocks 224 are attached to the plunger strip support 220 and the two spring roller supports 222 such that they are equally spaced angularly around the mid-section of the target cleaning end cap 216.

Figure 6A:
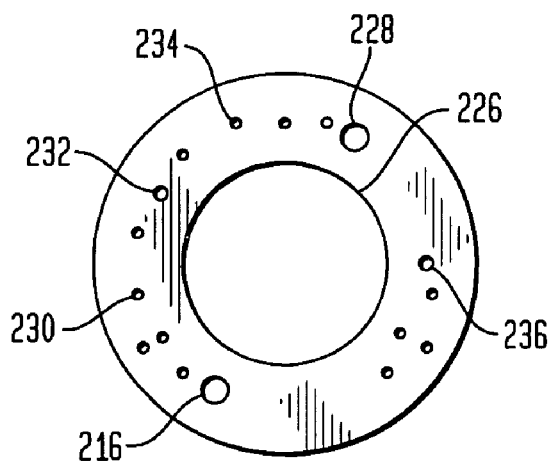
FIGS. 6A-6B are views of a target cleaning end cap of the target cleaning end cap assembly of FIG. 5.
Figure 6B:
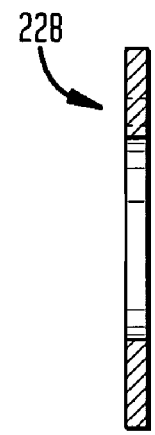

With reference to FIGS. 2, 5, and 6, the target cleaning end cap 216 is formed of a thin circular plate having a central hole 226. The diameter of the target cleaning end cap 216 is substantially equal to the inside diameter of the substrate cylindrical barrel 14 minus a very small dimensional tolerance to allow the target cleaning assembly 200 to freely move inside the substrate cylindrical barrel 14. The diameter of the central hole 226 is substantially equal to the outside diameter of the target cylindrical tube 12 to permit the target cleaning assembly 200 to freely translate along the target cylindrical tube 12. A plurality of fastener holes 228 are formed in the target cleaning end cap 216, such that their dimensions and locations match those of the fastener holes 212 of the target inner end plate 208.

FIG. 6 illustrates two such fastener holes 228. Four sets of smaller fastener holes 230, 232, 234, and 236 are also formed in the target cleaning end cap 216 to provide means of connection of the strip support 218, the plunger strip support 220, and the two spring roller supports 222, respectively, to the target cleaning end cap 216.

Figure 7A:
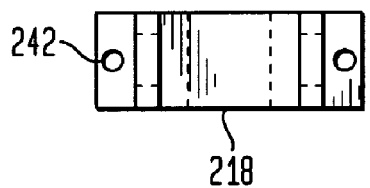
FIGS. 7A-7C are views of a strip support of the target cleaning end cap assembly of FIG. 5.
Figure 7B:
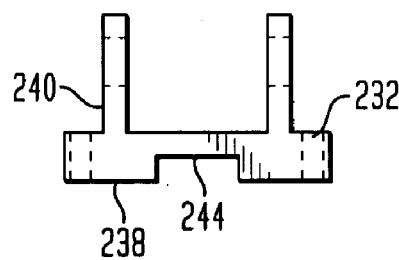
Figure 7C:
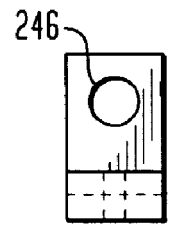

With specific reference to FIG. 7, the strip support 218 is generally comprised of a strip support base 238 and two strip support devises 240. The strip support base 238 is generally of a rectangular shape with a plurality of fastener holes 242 formed in the strip support base 238 at the two distal ends. The fastener holes 242 are generally of the same dimensions and locations as those of the fastener holes 230 of the target cleaning end cap 216. A rectangular profile recess 244 is formed on the bottom of the strip support base 238. The two strip support devises 240 are generally constructed of thin rectangular tabs that are secured to or integrally formed on and perpendicularly to the top of the strip support base 238. A circular hole 246 is formed on each of the strip support devises 240.

With further reference to FIG. 5, the strip support 218 is secured to the target cleaning end cap 216 via fasteners 248 through the fastener holes 230 and 242.

Figure 8A:
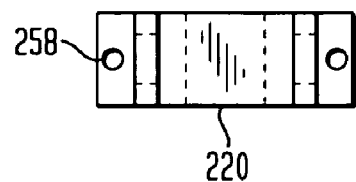
FIGS. 8A-8C are views of a plunger strip support of the target cleaning end cap assembly of FIG. 5.
Figure 8B:
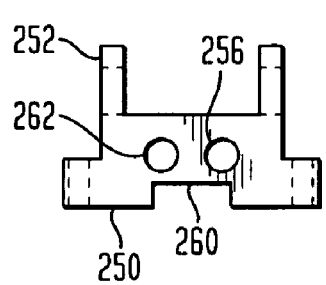
Figure 8C:
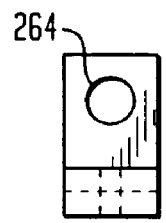

With specific reference to FIG. 8, the plunger strip support 220 is generally comprised of a plunger strip support base 250 and two plunger strip support devises 252. The plunger strip support base 250 is generally formed of a rectangular shape. Extending from either side of the plunger strip support base 250 are two small rectangular tabs 256 wherein two fastener holes 258 are formed. The two fastener holes 258 are generally of the same dimensions and locations as those of the fastener holes 232 of the target cleaning end cap 216. A rectangular profile recess 260 is formed on the bottom of the plunger strip support base 250. Two circular holes 262 are formed in the plunger strip support base 250 immediately above the rectangular recess 260. The two plunger strip support devises 252 are generally constructed of thin rectangular tabs that are integrally formed on and perpendicularly to the top of the plunger strip support base 250. A circular hole 264 is formed in each of the plunger strip support devises 252.

With further reference to FIG. 5, the plunger strip support 220 is secured to the target cleaning end cap 216 via fasteners 266 through the fastener holes 232 and 258, and is generally disposed diametrically opposite to the strip support 218. One of the roller blocks 224 is fitted inside the rectangular profile recess 260 between the plunger strip support 220 and the target cleaning end cap 216.

Figure 9A:
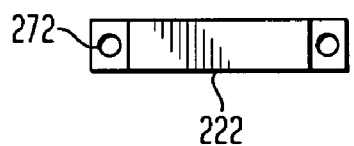
FIGS. 9A-9C are views of a spring roller support of the target cleaning end cap assembly of FIG. 5.
Figure 9B:
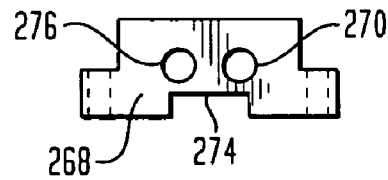
Figure 9C:

With specific reference to FIG. 9, the spring roller supports 222 are formed of a rectangular block 268. Extending from either side of the rectangular block 268 are two small rectangular tabs 270 wherein two fastener holes 272 are formed. The fastener holes 272 are generally of the same dimensions as those of, and furthermore are aligned with either the fastener holes 234 and 236 of the target cleaning end cap 216. A rectangular profile recess 274 is formed on the bottom of the rectangular block 268. Two circular holes 276 are formed in the rectangular block 268 and are disposed immediately above the rectangular recess 274.

With further reference to FIG. 5, the spring roller supports 222 are secured to the target cleaning end cap 216 at two locations via fasteners 278 through the fastener holes 234 and 272, and fasteners 280 through the fastener holes 236 and 272. Each of the roller blocks 224 is press fitted inside the rectangular profile recess 274 between the each of the spring roller support 222 and the target cleaning end cap 216.

Figure 10A:
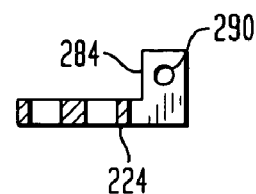
FIGS. 10A-10B are views of a roller block of the target cleaning end cap assembly of FIG. 5.
Figure 10B:
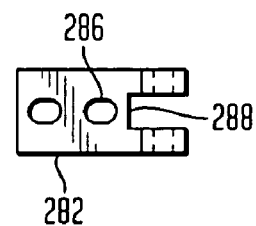

With reference to FIG. 10, the roller block 224 is generally comprised of a roller block base 282 and two roller block clevises 284. The roller block base 282 are generally constructed of a rectangular shape with two oval fastener holes 286 formed therein. The fastener holes 286 are generally aligned with the locations of the fastener holes 236 of the target cleaning end cap 216. A rectangular profile notch 288 is formed on one of the short sides of the roller block base 282, whereupon the two roller block devises 284 are extended integrally from and perpendicularly to the roller block base 282. A circular hole 290 is formed in each of the roller block devises 284.

Figure 11A:
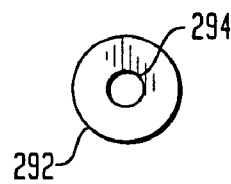
FIGS. 11A-11B are views of a roller element of the roller block of FIG. 10.
Figure 11B:
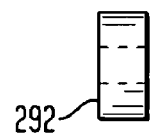

With reference to FIG. 11, a roller element 292 is formed of a solid cylinder having a small central hole 294. Be for example only, the diameter of the roller element 292 is of a dimension of 0.375 inches. The diameter of the small central hole 294 is generally the same as the diameter of the circular holes 290 of the roller block devises 284, and, be for example only, may be of a dimension of 0.13 inches. The width of the roller element 292 is slightly less than the spacing between the two roller block devises 284 and, be for example only, may be of a dimension of 0.156 inches. The roller element 292 is attached to the roller block 224 by a small pin inserted through the central holes 294 and the circular holes 290 of the roller block 224, so that a small amount of clearance exists between the two roller block devises 284 and the roller element 292 so as to enable it to freely rotate.

With further reference to FIG. 5, when assembled together with the roller blocks 224 into the target cleaning end cap assembly 204, the roller elements 292 partially extend slightly radially inward into the central hole 226 of the target cleaning end cap 216, so that they make contact with the target cylindrical tube 12 to allow the target cleaning assembly 200 to roll along the target cylindrical tube 12.

Figure 12A:
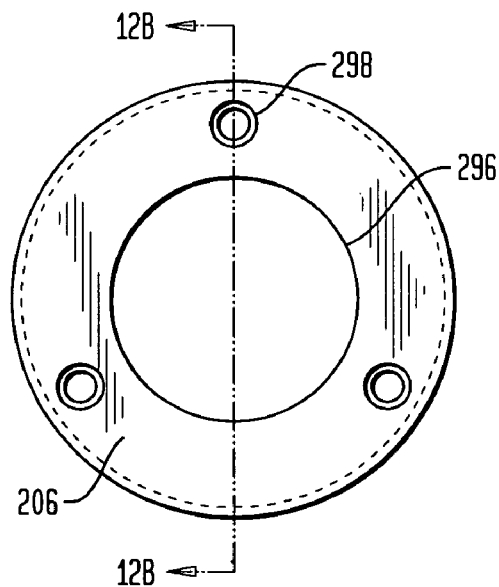
FIGS. 12A-12B are views of a target interface plate of the target cleaning assembly of FIG. 2.
Figure 12B:
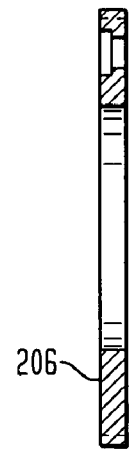

With specific reference to FIG. 12, the target interface plate 206 is made of a thin circular plate having a central hole 296. The diameter of the central hole 296 is substantially equal to the outside diameter of the target cylindrical tube 12 plus a very small tolerance to allow the target cleaning assembly 200 to freely move along the target cylindrical tube 12 without interference. A plurality of fastener holes 298 are formed in the target interface plate 206. FIG. 12 illustrates three such fastener holes 298 equally spaced circumferentially.

Figure 13A:
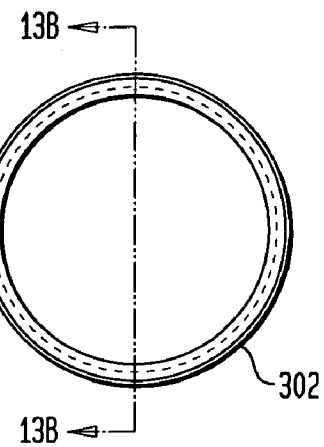
FIGS. 13A-13B are views of a substrate collector shield of the substrate cleaning assembly of FIG. 2.
Figure 13B:
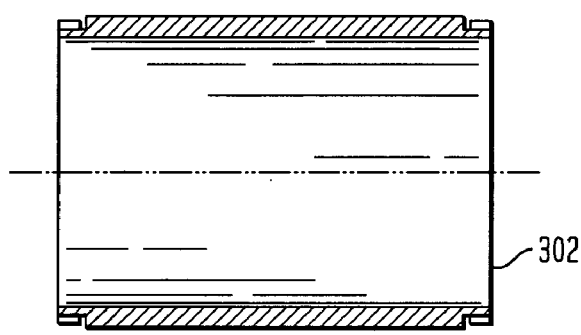

With reference to FIG. 13, the substrate collector shield 302 is generally formed of a metal electrical conducting cylindrical tube that fits closely outside the target cylindrical tube 12 with a high degree of precision. The inside diameter of the substrate collector shield 302 is substantially equal to the outside diameter of the target cylindrical tube 12 plus a very small dimensional tolerance to allow the substrate cleaning assembly 300 to freely move along the target cylindrical tube 12. Be for example only, the inside diameter of the substrate collector shield 302 may be of a dimension of 2.52 inches. At the two distal ends of the substrate collector shield 302 are formed two small external threaded areas whereon the magnet assemblies 304 are threaded into the substrate collector shield 302.

Figure 14:
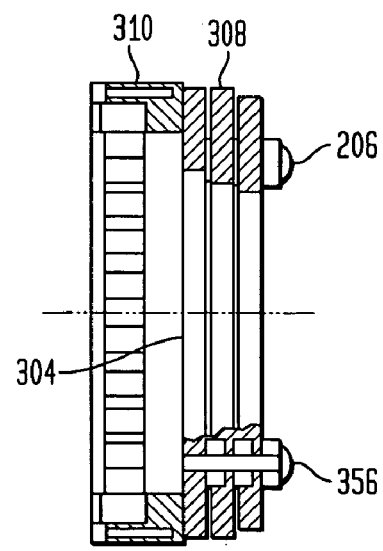
FIG. 14 is a cutaway view of one of the two magnet assemblies of the substrate cleaning assembly of FIG. 2, shown attached to the target interface plate of FIG. 12.

With reference to FIG. 14, one of the magnet assemblies 304 is secured to the target interface plate 206 on the distal end of the substrate cleaning assembly 300 adjacent to the target cleaning assembly 200, thus providing a physical connection of the target cleaning assembly 200 to the substrate cleaning assembly 300.

Figure 21A:
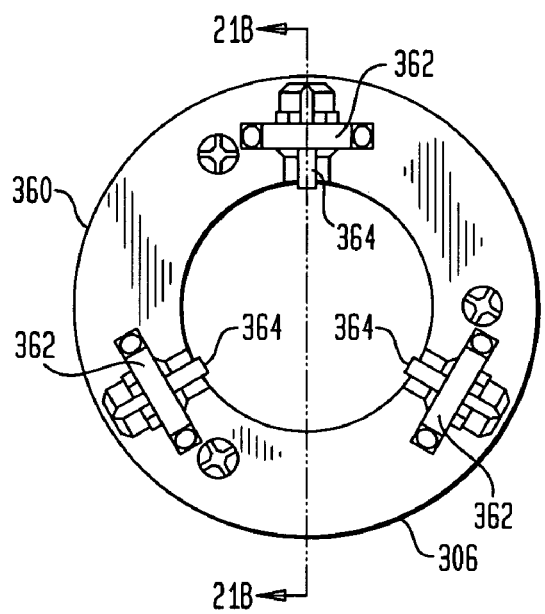
FIGS. 21A-21B are views of a substrate cleaning end cap of the substrate cleaning assembly of FIG. 2, also shown attached to the other magnet assembly of FIG. 14.
Figure 21B:
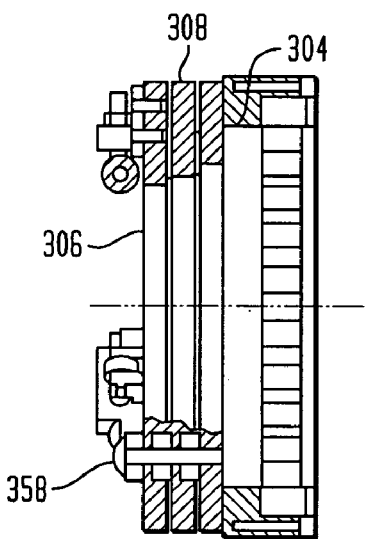

With reference to FIG. 21, the substrate cleaning end cap assembly 306 is secured to the other magnet assembly 304 on the other distal end of the substrate cleaning assembly 300. With further reference to FIGS. 14 and 21, the magnet assemblies 304 are generally comprised of a substrate outer end plate 308 and a magnet unit 310.

Figure 15A:
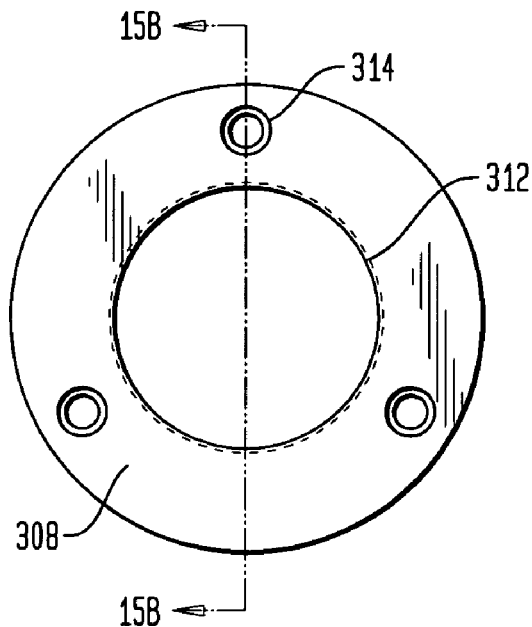
FIGS. 15A-15B are views of a Barrel Cleaner End, as labeled in FIG. 14, of the magnet assembly.
Figure 15B:
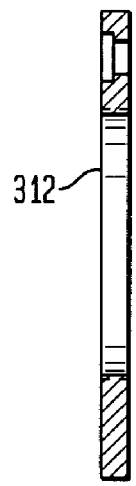

With specific reference to FIG. 15, each of the substrate outer end plates 308 is made of a thin circular plate having a threaded central hole 312 to enable it to be threaded into the substrate collector shield 302 at one of the distal ends. The diameter of the substrate outer end plates 308 is substantially equal to the inside diameter of the substrate cylindrical barrel 14 minus a very small dimensional tolerance to allow the substrate cleaning assembly 300 to freely move inside the substrate cylindrical barrel 14. A plurality of fastener holes 314 are formed in the substrate outer end plates 308 and generally are of the same dimensions and locations as those of the fastener holes 298 of the target interface plate 206. FIG. 15 illustrates three such fastener holes 314 equally spaced circumferentially. With further reference to FIG. 14, one of the substrate outer end plates 308 is secured to the target interface plate 206 via fasteners 356 through the fastener holes 298 and 314. The fasteners 356 also possess a certain electrical insulating property to provide an electrical isolation of the substrate cleaning assembly 300 from the target cleaning assembly 200.

Figure 16A:
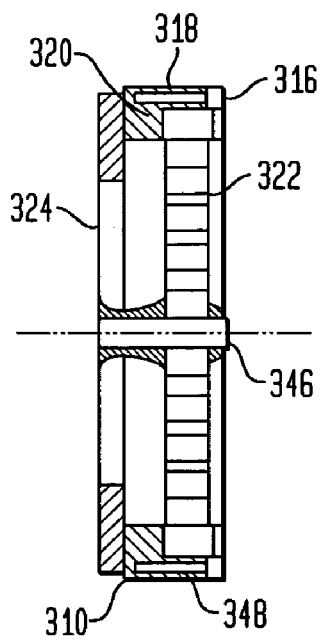
FIGS. 16A-16B are views of a magnet unit of the magnet assembly of FIG. 14.
Figure 16B:
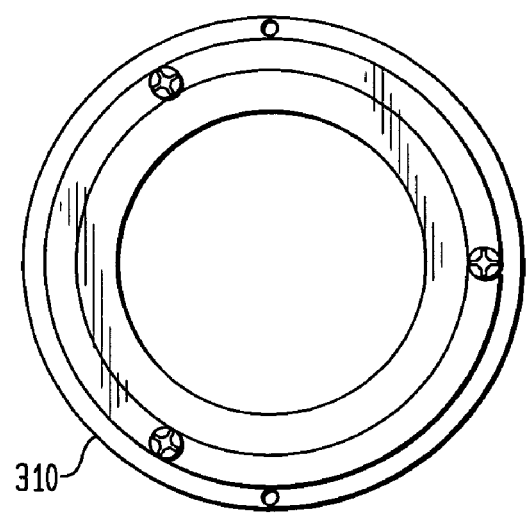

With reference to FIG. 16, each of the magnet units 310 is further comprised of a narrow keeper ring 316, a cleaner ring 318, a wide keeper ring 320, a plurality of magnets 322, and a magnet keeper cap 324.

Figure 17A:
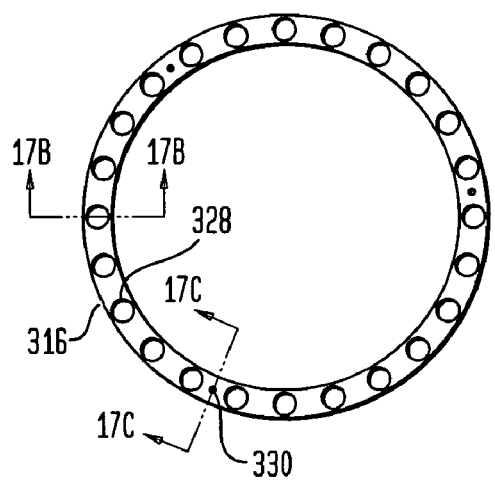
FIGS. 17A-17C are views of a narrow keeper ring of the magnet unit of FIG. 16.
Figure 17B:
Figure 17C:

With specific reference to FIG. 17, each of the narrow keeper rings 316 is formed of a thin circular ring having a rectangular cross section. A plurality of circular indentations 328 are formed on top of each of the narrow keeper rings 316. Be for example only, 24 such circular indentations 328 may be used for each of the narrow keeper rings 316. A plurality of fastener holes 330 are formed in each of the narrow keeper rings 316. Be for example only, FIG. 17 illustrates three such fastener holes 330.

Figure 18A:
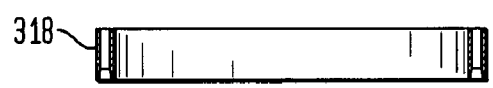
FIGS. 18A-18B are views of a cleaner ring of the magnet unit of FIG. 16.
Figure 18B:
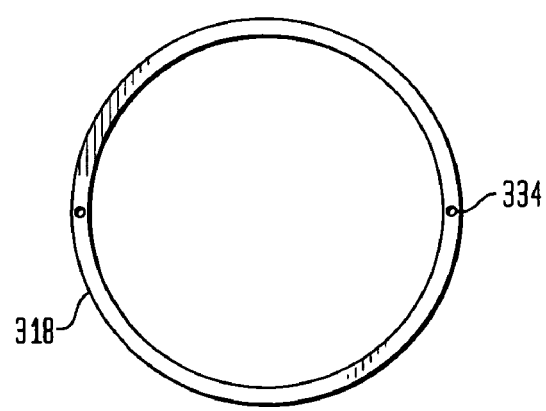

With reference to FIG. 18, each of the cleaner rings 318 is formed of a circular ring having a rectangular cross section wherein two diametral fastener holes 334 are formed. The thickness of the cleaner rings 318 is substantially greater than its radial thickness. The inside diameter of the cleaner rings 318 is substantially equal to the outside diameter of the narrow keeper rings 316 plus a very small dimensional tolerance. Similarly, the outside diameter of the cleaner rings 318 is substantially equal to the inside diameter of the substrate cylindrical barrel 14 minus a small dimensional clearance to permit the substrate cleaning assembly 300 to translate freely inside the substrate cylindrical barrel 14. With further reference to FIG. 16, when assembled into the magnet units 310, the narrow keeper rings 316 fits tightly inside and flush with the cleaner rings 318.

Figure 19:
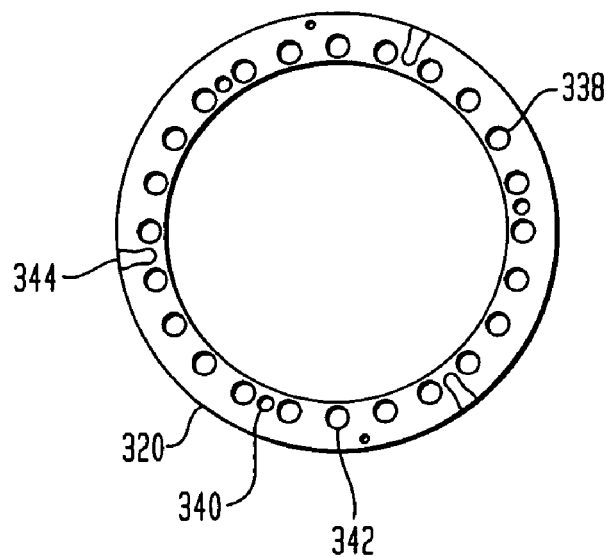
FIG. 19 is a top view of a wide keeper ring of the magnet unit of FIG. 16.

With reference to FIG. 19, each of the wide keeper rings 320 is formed of a wide circular ring having a rectangular cross section. The inside diameter of the wide keeper rings 320 is substantially larger than the outside diameter of the substrate collector shield 302. A plurality of circular indentations 338 are formed on top of each of the wide keeper rings 320 and offset towards the inside diameter of the wide keeper rings 320. Be for example only, 24 such circular indentations 338 may be used for each of the wide keeper rings 320.

The circular indentations 338 are of the same dimensions and locations as those of the circular indentations 328 of the narrow keeper rings 316. Three sets of fastener holes 340, 342, and 344 are formed in each of the wide keeper rings 320. The fastener holes 340 are generally larger with same locations as the fastener holes 330 of the narrow keeper rings 316, thus allowing the wide keeper rings 320 to secure to the narrow keeper rings 316 via fasteners 346 as illustrated in FIG. 16. The fastener holes 342 are generally of the same dimensions and locations as those of the fastener holes 334 of the cleaner rings 318, thus allowing the wide keeper rings 320 to secure to the cleaner rings 318 via fasteners 348 as illustrated in FIG. 16. The fastener holes 344 are formed into the side of each of the wide keeper rings 320. With further reference to FIG. 16, when assembled into the magnet units 310, the wide keeper rings 320 are disposed oppositely to the narrow keeper rings 316 and are separated by the cleaner rings 318.

With specific reference to FIG. 16, the magnets 322 are made of a permanent ferromagnetic material such as Alnico 8 (i.e., a material made of aluminum, nickel, and cobalt), and are generally of a cylindrical shape. The diameter of the magnets 322 is generally the same as the diameters of the circular indentations 328 and 338. The length of the magnets 322 is defined by the separation distance between the circular indentations 328 and the circular indentations 338 when the narrow keeper rings 316, the cleaner rings 318, and the wide keeper rings 320 are assembled together. Be for example only, 24 such magnets 322 may be used for each of the magnet units 310. When assembled into the magnet units 310, the distal ends of the magnets 322 are fitted tightly inside the circular indentations 328 and 338 with the side of the magnets 322 in contact with the inside diameter of the cleaner rings 318.

Figure 20A:
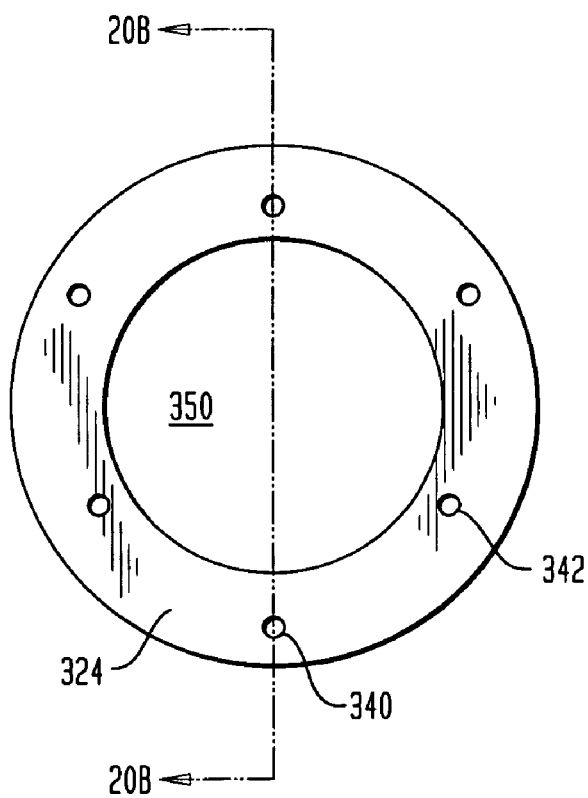
FIGS. 20A-20B are views of a magnet keeper cap of the magnet unit of FIG. 16.
Figure 20B:
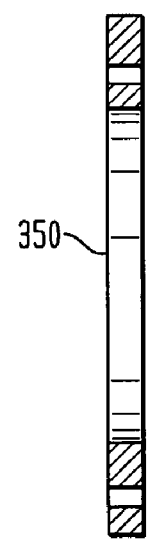

With reference to FIG. 20, each of the magnet keeper caps 324 is formed of a thin circular plate having a central hole 350. The diameter of the magnet keeper caps 322 is substantially equal to the inside diameter of the substrate cleaning assembly 300 minus a very small dimensional tolerance to enable the substrate cleaning assembly to freely move inside the substrate cylindrical barrel 14. Similarly, the diameter of the central hole 350 is substantially the same as the outside diameter of the substrate collector shield 302. Two sets of fasteners 352 and 354 are formed in each of the magnet keeper caps 322. The fastener holes 352 are of the same dimensions and locations as those of the fasteners 330 of the narrow keeper rings 316 and 340 of the wide keeper rings 320, through which the magnet keeper caps 322 are secured to the wide keeper rings 320 via the fasteners 346, as shown in FIG. 16. The fastener holes 354 are of the same dimensions and locations as those of the fasteners holes 314 of the substrate outer end plates 308, through which the magnet keeper caps 322 are secured to the substrate outer end plates 308 via the fasteners 356 to form the magnet assemblies 304, as illustrated in FIG. 16.

With reference to FIG. 21, the substrate cleaning end cap assembly 306 is secured to one of the substrate outer end plates 308 of the one of the magnet assembly 304 via a plurality of fasteners 358 through the fastener holes 314 of the substrate outer end plate 308. The substrate cleaning end cap assembly 306 is generally comprised of a substrate cleaning end cap 360, three spring roller supports 362, and three roller blocks 364.

Figure 22A:
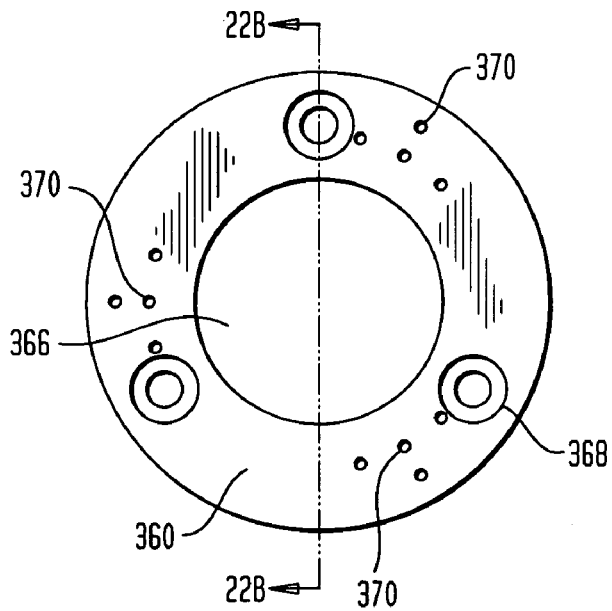
FIGS. 22A-22B are views of a substrate cleaning end cap of the substrate cleaning end cap assembly of FIG. 21.
Figure 22B:

With specific reference to FIG. 22, the substrate cleaning end cap 360 is formed of a thin circular plate having a central hole 366. The diameter of the substrate cleaning end cap 360 is generally the same as the inside diameter of the substrate cylindrical barrel 14 minus a very small dimensional tolerance to allow the substrate cleaning assembly 200 to freely move inside the substrate cylindrical barrel 14. Similarly, the diameter of the central hole 366 is generally the same as the outside diameter of the target cylindrical tube 12 plus a very small dimensional tolerance to permit the substrate cleaning assembly 200 to slide freely along the target cylindrical tube 14. A plurality of fastener holes 368 are formed in the substrate cleaning end cap 216, such that their dimensions and locations match those of the fastener holes 314 of the substrate outer end plate 308. FIG. 22 illustrates three such fastener holes 368. Three sets of smaller fastener holes 370 are also formed in the substrate cleaning end cap 360 to provide a means of securing the three spring roller supports 362 to the substrate cleaning end cap 360.

With further reference to FIG. 9, the spring roller supports 362 of the substrate cleaning end cap assembly 306 are identical in design to the spring roller supports 222 of the target cleaning end cap assembly 204.

With further reference to FIG. 10, the roller blocks 364 of the substrate cleaning end cap assembly 306 are identical in design to the roller blocks 224 of the target cleaning end cap assembly 204.

The functionality of the preferred embodiment will now be described in details in connection with FIG. 1 in order to provide a clearer appreciation of the advantages afforded by the in-situ plasma cleaning device 100 of the present invention.

The target cylindrical tube 12 generally provides a source material for the cylindrical magnetron sputtering process. This source material is to be deposited onto the substrate cylindrical barrel 14 during the cylindrical magnetron sputtering process. Prior to this process, the target cylindrical tube 12 and the substrate cylindrical barrel 12 are required to undergo an atomic surface cleaning process. The atomic cleaning process is designed to remove contaminants at the atomic level from the surfaces of the target cylindrical tube 12 and the substrate cylindrical barrel 12, thus leaving these surfaces virtually at their highest purity state for the subsequent cylindrical magnetron sputtering.

Referring now to FIG. 1, a target cleaning magnetic field 400 is generated by field producing means within the target cleaning annular space 402 between the target cylindrical tube 12 and the target collector shield 202. The target cleaning magnetic field 400 is generally directed axially in the direction of the cylindrical centerline 600. To enable the atomic cleaning process of the target cylindrical tube 12, a voltage is applied across the target collector shield 202 and the target cylindrical tube 12 with the positive potential applied to the target collector shield 202 and the negative potential applied to the target cylindrical tube 12. The presence of the target cleaning magnetic field 400 in the axial direction together with said applied voltage thus creates a plasma. The plasma generally is composed of positively charged ions and negatively charged electrons. The plasma can further be locally tuned within the target cleaning annular space 402 by adjusting the strength of the target cleaning magnetic field 400 accordingly.

As a result, the negative potential of the target cylindrical tube 12 generally attracts the positively charged ions in the plasma. These positively charged ions accelerate towards the target cylindrical tube 12 at a high speed and impact with the material of the target cylindrical tube 12 at an atomic level. The resulting ion bombardment thus causes particles of contaminants and, to a lesser extent, the source material of the target cylindrical tube 12 at the atomic level to separate from the surface of the target cylindrical tube 12. With sufficient kinetic energy developed from the ion bombardment, these ejected particles of the contaminants and the source material separated from the target cylindrical tube 12 generally travel towards and therefore are deposited onto the target collector shield 202.

Similarly, with reference to FIG. 1, the magnet assemblies 304 are configured to generate a substrate cleaning magnetic field 500 in the axial direction within the substrate cleaning annular space 502 between the substrate cylindrical barrel 14 and the substrate collector shield 302. A voltage is applied across the substrate cylindrical barrel 14 and the substrate collector shield 302, with the substrate cylindrical barrel 14 at a negative potential and the substrate collector shield 302 at a positive potential. The substrate cleaning magnetic field 500 together with said applied voltage then generates a plasma composed of positively and negatively charged ionized particles within the substrate cleaning annular space 502. The plasma can further be locally tuned within the substrate cleaning annular space 502 by adjusting the strength of the substrate magnetic field 500 accordingly.

An electrostatic attraction force is thus created between the negatively charged substrate cylindrical barrel 14 and the positively charged ions in the plasma. Consequently, the positively charged ions generally accelerate towards the negatively charged substrate cylindrical barrel 14 at high speed and impact with the material of the substrate cylindrical barrel 14 at an atomic level. The resulting ion bombardment thus causes the particles of contaminants at the atomic level to separate from the surface of the substrate cylindrical barrel. With sufficient kinetic energy resulting from the ion bombardment, these particles of the contaminants generally travel towards and are subsequently deposited onto the positively charged substrate collector 302.

A significant feature of the in-situ plasma cleaning device 100 is that the atomic surface cleaning can be performed selectively on either the substrate cylindrical barrel 14 or the target cylindrical tube 12 or both simultaneously by running each cleaner at different voltages from different power supplies, or alternatively to adjust the magnetic field's strengths so that each cleaner runs well at the same voltage thus allowing common connection of their anodes, together or to the same power supply. This feature is a significant time saving aspect of the present invention in contrast with the serial cleaning method of the conventional method involving removing and inserting different types of collector shield into the long cylindrical system 10.

Moreover, a further significant feature of the present invention is the ability of the in-situ plasma cleaning device 100 to perform the atomic surface cleaning of the long cylindrical system 10 in a closed volume process. Because the target collector shield 202 and the substrate collector shield 302 are integral to the in-situ plasma cleaning device 100, the atomic surface cleaning is generally performed with the target cylindrical tube 12 and the substrate cylindrical barrel 14 closed to the ambient atmospheric environment. As a result, the possibility of recontamination is eliminated. The resulting atomic cleaning by the in-situ plasma cleaning device 100 thus creates a very high purity state on the surfaces of the target cylindrical tube 12 and the substrate cylindrical barrel 14 to prepare them for the subsequent cylindrical magnetron sputtering. Consequently, upon the deposition of the source material from the target cylindrical tube 12 onto the substrate cylindrical barrel 14 in the area already atomically cleaned by the in-situ plasma cleaning device 100, the quality of coating and the surface adhesion will be substantially improved over that of the conventional method.

Figure 23:
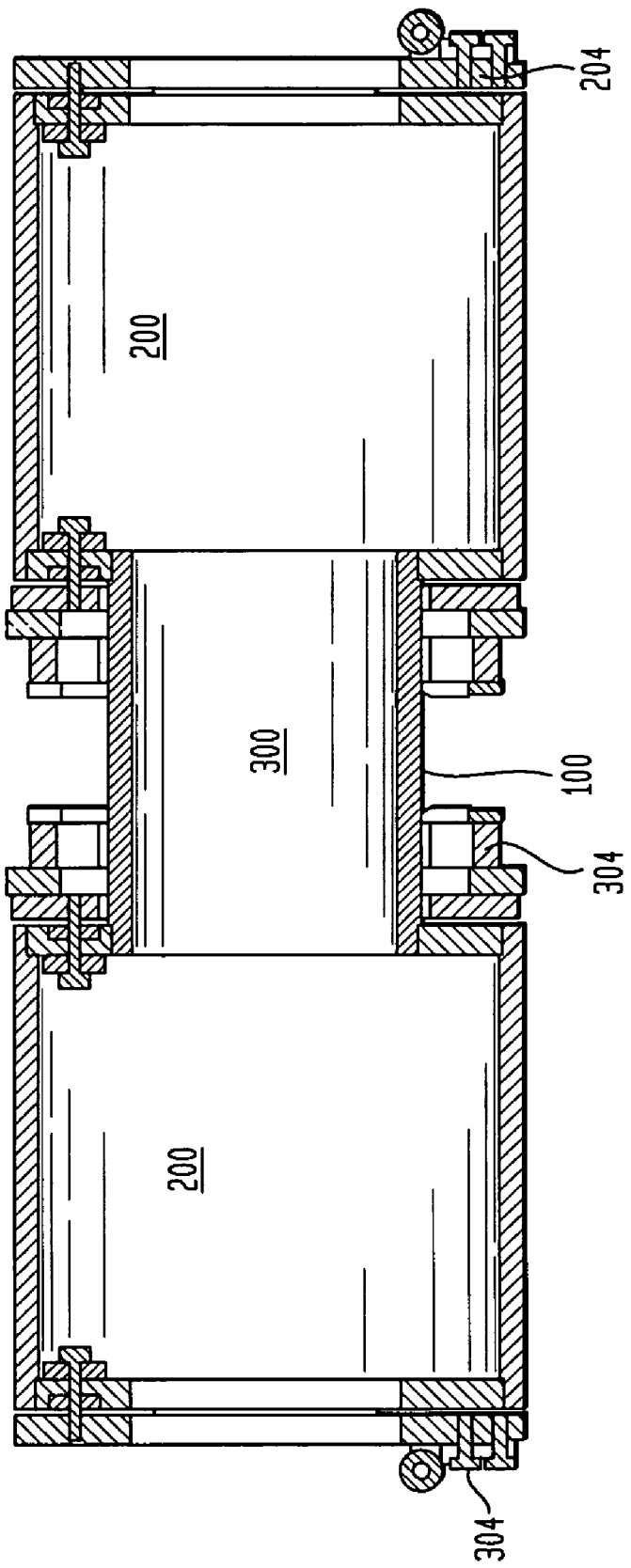
FIG. 23 is a cross-sectional view of the in-situ plasma cleaning device, made according to an alternative embodiment of the present invention.

Yet, another advantage of the present invention lies in the modular design of the in-situ plasma cleaning device 100. Referring now to FIG. 23, an alternative embodiment of the present invention is shown. The in-situ plasma cleaning device 100, according to the alternative embodiment, is comprised of two target cleaning assemblies alternating between a substrate cleaning assembly. Two target cleaning end caps 204 are positioned at two distal ends of the in-situ plasma cleaning device 100 to enable it to traverse along the long cylindrical system 10. Thus, in this fashion, the in-situ plasma cleaning device may be constructed from an alternate arrangement of the target cleaning assemblies 200 and the substrate cleaning assemblies 300. This modular design of the in-situ plasma cleaning device 100 enables it to adapt virtually to any long cylindrical system 10 having a variable length, while maintaining its ability to perform the atomic surface cleaning in a closed volume process.

It should be understood that the geometry, compositions, and dimensions of the elements described herein can be modified within the scope of the invention and are not intended to be the exclusive; rather, they can be modified within the scope of the invention. Other modifications can be made when implementing the invention for a particular environment.

The invention claimed is:

1. An in-situ plasma cleaning device for performing an atomic surface cleaning process to remove contaminants, comprising:
   a cleaning assembly;
   a magnetic field generator, located within the cleaning assembly, that generates a generally axially directed magnetic field to provide a plasma for cleaning a surface within the cleaning assembly;
   wherein the cleaning assembly comprises a collector shield disposed opposite to the surface to be cleaned for collecting the contaminants and by-product material, wherein the cleaning assembly traverses the length of a target cylindrical surface and a substrate cylindrical surface during a cleaning process.

* * * * *